(12) United States Patent
Katooka et al.

(10) Patent No.: US 7,300,293 B2
(45) Date of Patent: Nov. 27, 2007

(54) ATTACHMENT FOR PREVENTING COVER FROM FALLING OFF

(75) Inventors: Masao Katooka, Osaka (JP); Shuji Yokoyama, Osaka (JP); Yoshimasa Kawashima, Osaka (JP)

(73) Assignee: Sansha Electric Manufacturing Company, Limited, Osaka-shi (JP)

( * ) Notice: Subject to any disclaimer, the term of this patent is extended or adjusted under 35 U.S.C. 154(b) by 0 days.

(21) Appl. No.: 11/560,081

(22) Filed: Nov. 15, 2006

(65) Prior Publication Data

US 2007/0117443 A1 May 24, 2007

(30) Foreign Application Priority Data

Nov. 18, 2005 (JP) ............................... 2005-333989

(51) Int. Cl.
*H01R 13/44* (2006.01)
(52) U.S. Cl. ..................................... 439/142
(58) Field of Classification Search ................ 439/142, 439/144; 200/333; 220/840, 337
See application file for complete search history.

(56) References Cited

U.S. PATENT DOCUMENTS

| RE31,086 E | * | 11/1982 | Johnson et al. | ............. | 220/840 |
| 6,825,441 B2 | | 11/2004 | Katooka et al. | | |
| 2007/0102392 A1 | * | 5/2007 | Hoepner et al. | ............ | 215/237 |

* cited by examiner

*Primary Examiner*—Phuong Dinh
(74) *Attorney, Agent, or Firm*—Duane Morris LLP (57) ABSTRACT

An attachment (10) for preventing a cover (4) from falling off from a housing (1) is provided. The cover (4) includes an elastic member (54) on each of the right and lefts ends thereof. The elastic members are made elastically deformable by forming slits (56) in the cover (4). The elastic members (54) each have a protrusion (52). In order to mount the cover (4) to the housing (1), the protrusions (52) are inserted into respective ones of holes (7) formed in the housing (1) by inwardly deforming and, then, restoring the elastic members (54). After mounting the cover (4) to the housing (1), the cover falling-off preventing attachment (10) is attached to the cover (4), with side walls 18 of the attachment (10) positioned to extend into the respective slits (56), whereby the deformation of the elastic members (54) is prevented.

6 Claims, 12 Drawing Sheets

ATTACHMENT FOR PREVENTING COVER FROM FALLING OFF

This invention relates to an attachment for preventing a cover from falling off from, for example, a housing of an electronic apparatus to which it is mounted.

BACKGROUND OF THE INVENTION

Figure 1:
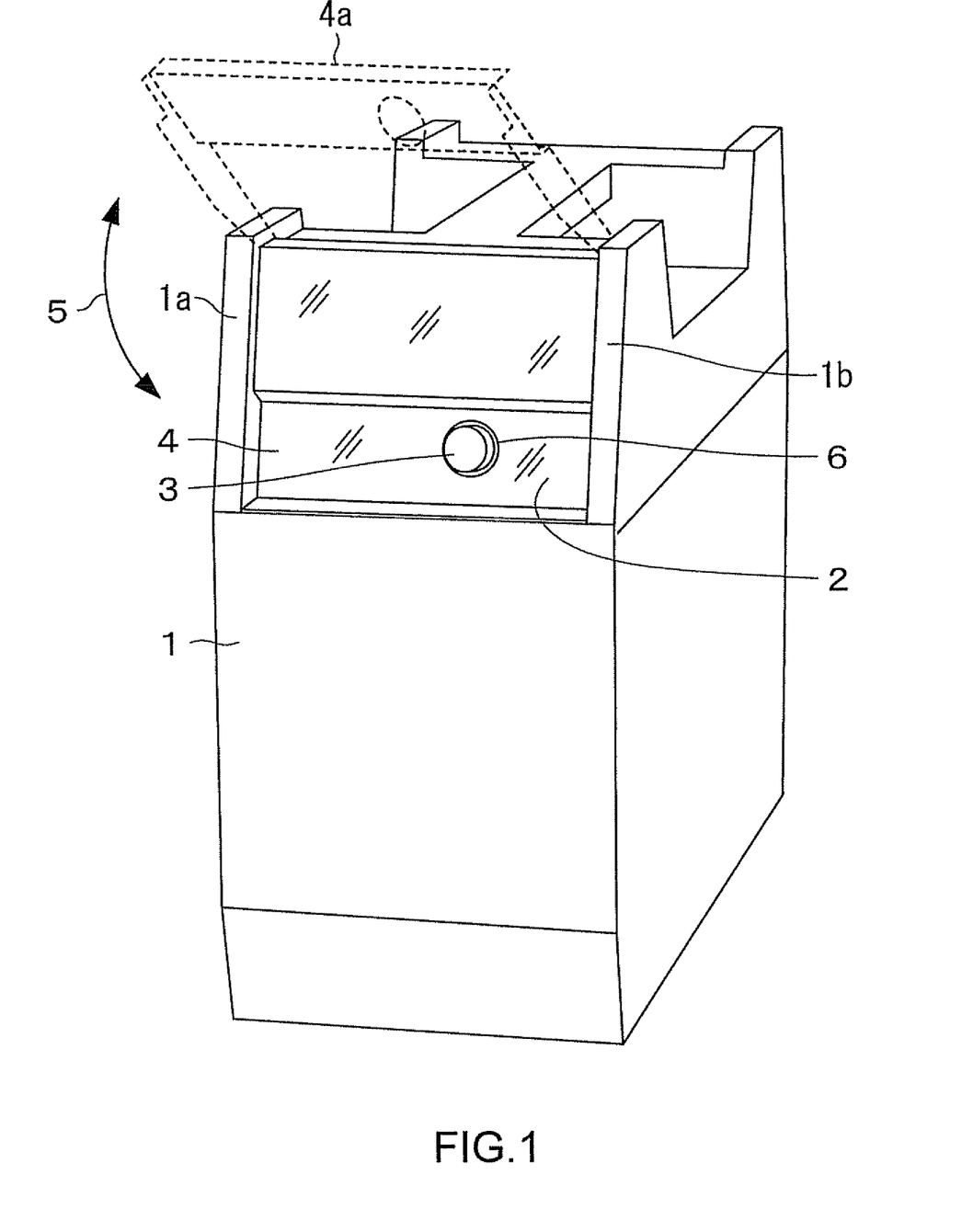
FIG. 1 is a perspective view of an arc welder power supply apparatus with a cover to which a cover falling-off preventing attachment according to the present invention can be attached.

Some electronic apparatuses are provided with a cover to protect a part of an apparatus, e.g. a console, or a control panel. An example of such apparatus is a power supply apparatus for arc welding machines with a cover attached to it, disclosed in Catalogue No. 291W71 DITJ-0400-0.3 (TD) 285 for a full-digital inverter TIG welder "SANARG ID/IA Series" manufactured by Sansha Electric Manufacturing Company, Limited. As shown in FIG. 1, this power supply apparatus includes a generally box-shaped housing 1, and a console 2 generally rectangular in shape is mounted to an upper front portion of the housing 1. Although not shown, a plurality of controls and indicators are operatively disposed on the console 1, including a jog dial 3 acting as a multi-functional control. A generally rectangular cover 4 is adapted to cover the entire surface of the console 2.

As indicated by an arrow 5 in FIG. 1, the cover 4 can rotate about an axis located near the upper edge of the cover 4. When a control on the console 2 is to be operated, the cover 4 is rotated upward to a position indicated by broken lines 4a. Since the jog dial 3 is operated more frequently than other controls, it is so arranged so as to be operated through a through-hole 6 in the cover 4 even when the cover 4 is in its closed position.

Figure 2A:
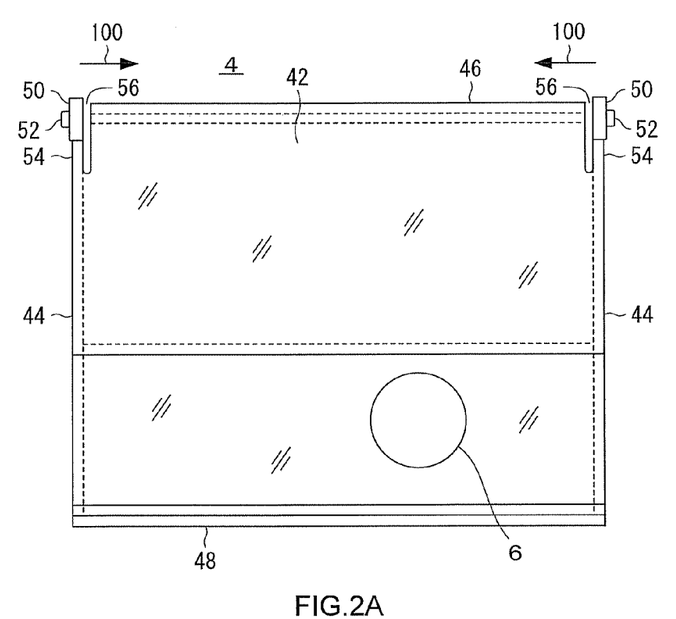
FIG. 2A is a front view of the cover of FIG. 1.
Figure 2B:
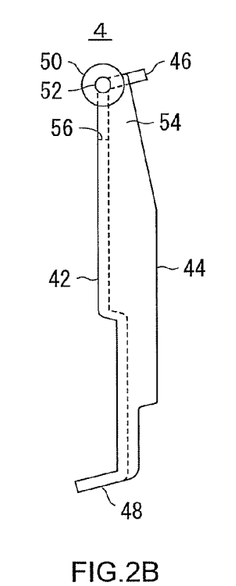
FIG. 2B is a side view of the cover of FIG. 1.
Figure 2C:
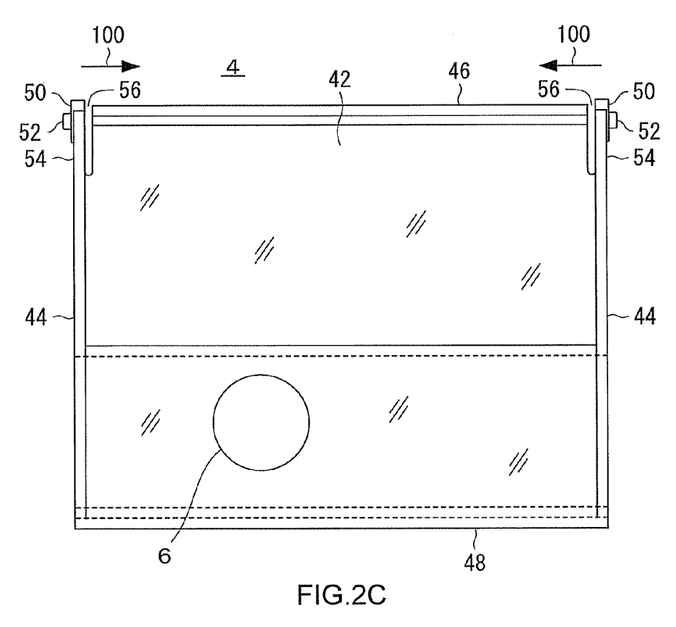
FIG. 2C is a rear view of the cover of FIG. 1.
Figure 2D:
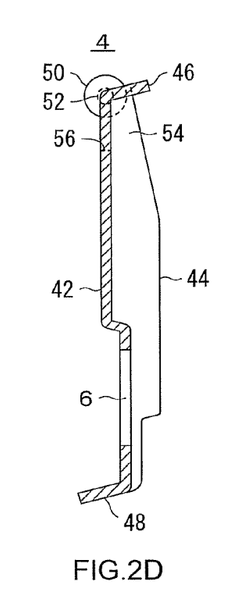
FIG. 2D is a cross-sectional view along a line 2D-2D in FIG. 2A.

As shown in FIGS. 2A and 2C, the cover 4 has a generally flat main section 42. Two side walls 44 extend along right and left side edges of the main section 42 in such a manner as to face each other. Top and bottom walls 46 and 48 are formed respectively along the upper and lower edges of the main section 42. The main section 42 is adapted to overlie the console 2. The through-hole 4 is formed in a relatively lower portion of the main section 42. The lower portion of the main section 42 including the through-hole 6 is set back toward the housing 1 (FIG. 1) so that a relatively large portion of the jog dial 3 can protrude out through the through-hole 6, facilitating easy operation of the jog dial 3.

The opposing side walls 44 are perpendicular to the main section 42 and extend backward, i.e. toward the housing 1. Each of the side walls 44 includes a thick disc-shaped portion 50 disposed on the extension of the upper edge of the main section 42. A retainer, e.g. a short columnar protrusion 52, is formed to extend outward from the center of each disc-shaped portion 50 along the extension of the upper edge of the main section 42. The upper portions 54 of the side walls 44 including the protrusions 52 can be elastically deformed when external force is exerted to them in the inward direction as indicated by arrows 100 in FIGS. 2A and 2C. For that purpose, slits 56 are formed to extend from the opposite ends of the upper edge of the main section 42 to locations somewhat below the respective disc-shaped portions 50.

An upper wall 46 extends backward from the upper edge of the main section 42 at an obtuse angle larger by 10 degrees than right angles. The slits 56 formed in the main section 42 extend into the upper wall 46 so that they are located between the respective side walls 44 and the upper portions 54 of the main section 42.

The lower wall 48, too, is at an obtuse angle larger by about 10 degrees than right angles with respect to the main section 42, but it extends forward, i.e. away from the housing 1. The front surface of the console 2 covered by the main section 42 faces diagonally upward at an angle of about 10 degrees with respect to the vertical plane, and the lower and upper walls 48 and 46 are at an obtuse angle with respect to the main section 42, so that the lower and upper walls 48 and 46 can assume the horizontal position when the cover 4 is placed over the console 2.

The cover 4 is formed of a synthetic resin, e.g. polycarbonate resin, and is formed as a single member. The width of the main section 42 is dependent on the size of the housing to which the cover 4 is to be mounted, but it may be, for example, about 150 mm. The height may be about 120 mm. The backward dimension of the main section 42, i.e. the distance between the foremost and rearmost edges of each of the side walls 44, does not exceed about 15 mm, and the forward dimension, i.e. distance over which the lower wall 48 extends, is about 12 mm. The thickness of the cover 4 is about 3 mm over its entirety. The length of the slits 56 is about 20 mm, and the width is about 2 mm. The length of the protrusions 52 is also about 2 mm.

Figure 3:
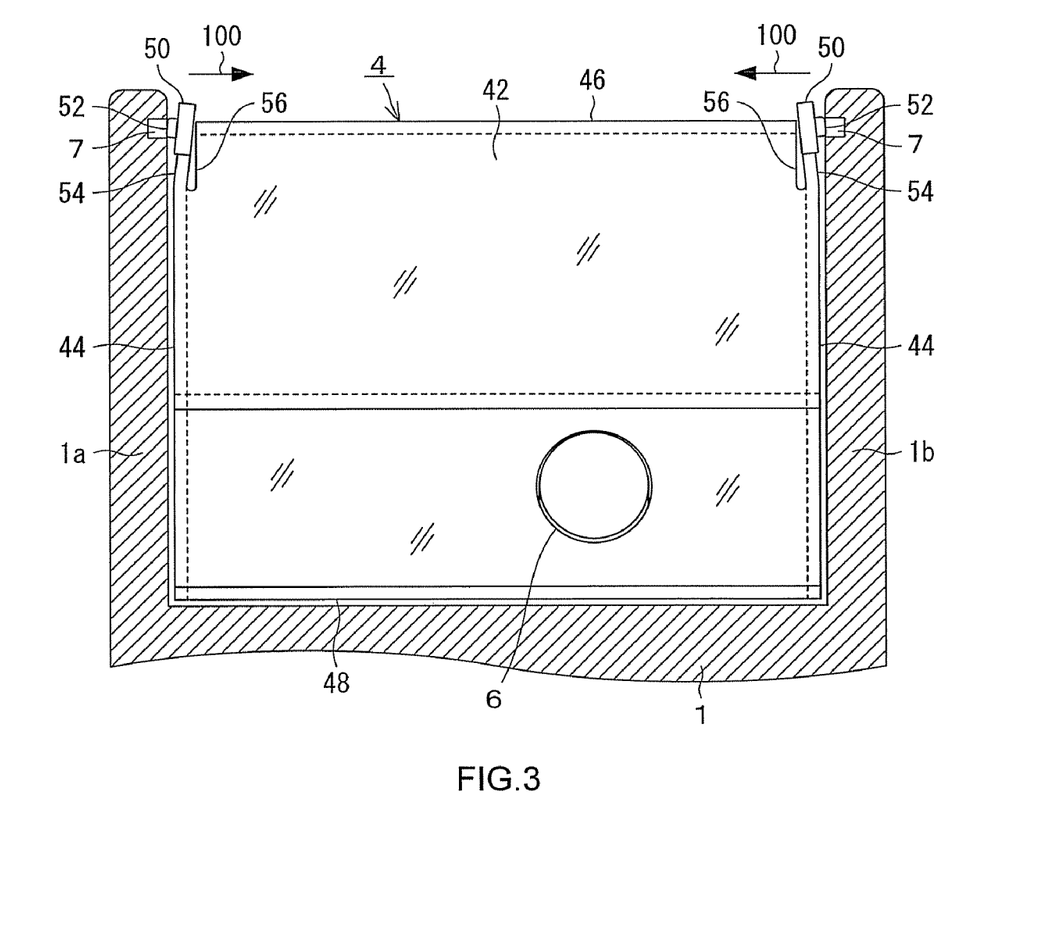
FIG. 3 is a partially broken-away front view of a housing of an arc welder power supply apparatus, illustrating how the cover of FIG. 2 is mounted.
Figure 4:
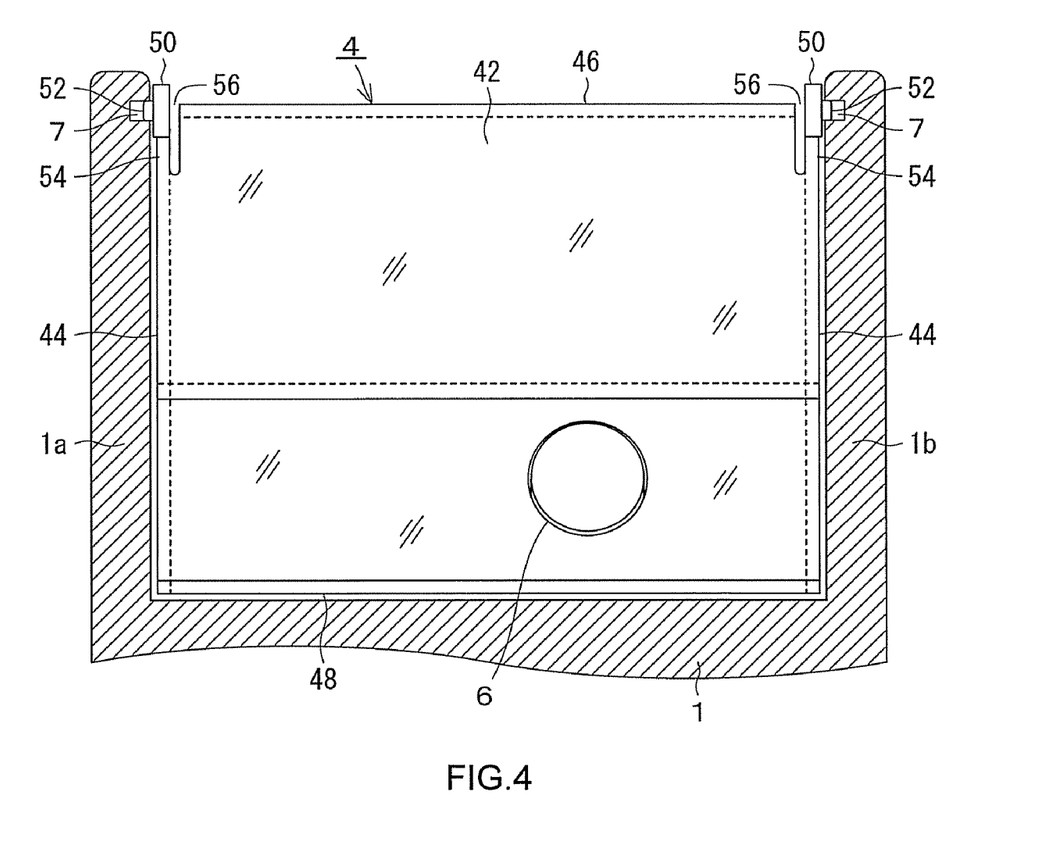
FIG. 4 is a partially broken-away front view of the housing of the arc welder power supply apparatus, to which the cover of FIG. 2 has been mounted.

When the cover 4 is attached to the housing 1, the upper elastic portions 54 of the side walls 44 including the protrusions 52 are bent inward as indicated by arrows 100 in FIG. 3 by, for example, an assemblyman. Then, the entire cover 4 is placed in position with respect to the housing 1, e.g. into the space between opposing two side walls 1a of the housing 1, where the protrusions 52 are in alignment with associated holes 7 respectively formed in the side walls 1a of the housing 1. The elastic portions 54 are then released so that the protrusions 52 can fit into the associated holes 7 by virtue of the elastic restoration of the elastic portions 54, as shown in FIG. 4. Thus, the cover 4 is mounted to the housing 1 in such a manner as to be able to rotate about an axis passing through the protrusions 52.

In order for the respective protrusions 52 to be fitted into the holes 7 through the elastic deformation of the elastic portions 54 including the protrusions 52, the distance between the openings of the opposing holes 7 should be larger than the distance between the tip ends of the protrusions 52 when they are elastically bent inward, smaller than the distance between the tip ends of the protrusions 52 when they elastically restore their original position, and larger than the distance between the proximal ends of the protrusions 52 when they are in their restored position. Furthermore, the depth of each hole 7 should be larger than the length of the associated one of the protrusions 52.

If the cover 4 is pulled forward or upward with a strong force, the elastic portions 54 including the protrusions 52 may sometimes be elastically deformed to cause the protrusions 52 to slip off from the holes 7, resulting in disengagement or falling-off of the cover 4 from the housing 1. Repetitive disengagement of the cover 4 will then cause reduction of the mechanical strength of the elastic portions 54, possibly leading to ultimate breakage of the elastic portions 54.

An object of the present invention, therefore, is to provide an attachment for preventing a cover attached to a housing from falling off to thereby prevent the cover from being broken.

SUMMARY OF THE INVENTION

A cover to which an attachment for preventing the cover from falling off from a housing is to be attached has a retainer deformable in a given direction. The retainer is deformed in a given direction in order for the cover to be mounted to the housing at a given position thereof. For example, the retainer may includes two rod-shaped retaining members formed to protrude outward from opposing sides of the cover. The retaining members are adapted to be inserted into corresponding retaining holes respectively formed in two walls of the housing, which are spaced by a distance slightly smaller than the distance between the tip ends of the two retaining members. When inserted into the retaining holes, the retaining members are deformed inwardly, i.e. in the direction toward each other. The cover falling-off preventing attachment according to the present invention includes deformation preventing means for preventing the retaining members of the cover from being deforming in the given direction after the cover is mounted to the housing.

Except that the cover is broken, the retaining member of the cover must be deformed in a given direction, e.g. inwardly, in order for the cover to fall off from the housing. According to the present invention, there is provided deformation preventing means for preventing the retaining member from being deformed in the given direction so that the cover can be prevented from falling off from the housing.

Sometimes, the cover may have a space necessary for the retainer to be deformed in the given direction. In such case, it is desirable to adapt the deformation preventing means to enter into the space so as to prevent the deformation of the retaining member in the given direction.

If the cover has a retainer including a plurality of retaining members, it is desirable to provide a corresponding number of deformation preventing means.

When a plurality of deformation preventing means are used, coupling means for coupling the respective deformation preventing means together may be provided, so that the deformation preventing means can be easily handled.

The cover falling-off preventing attachment according to the present invention is desirably of the same color as the cover, so that the unity in design of the cover as a whole can be preserved.

More specifically, it is desirable to form the cover falling-off preventing attachment of the same material as the cover.

BEST MODE OF THE INVENTION

A cover falling-off preventing attachment 10 according to a first embodiment of the present invention is described with reference to FIGS. 5 through 9B.

Figure 5:
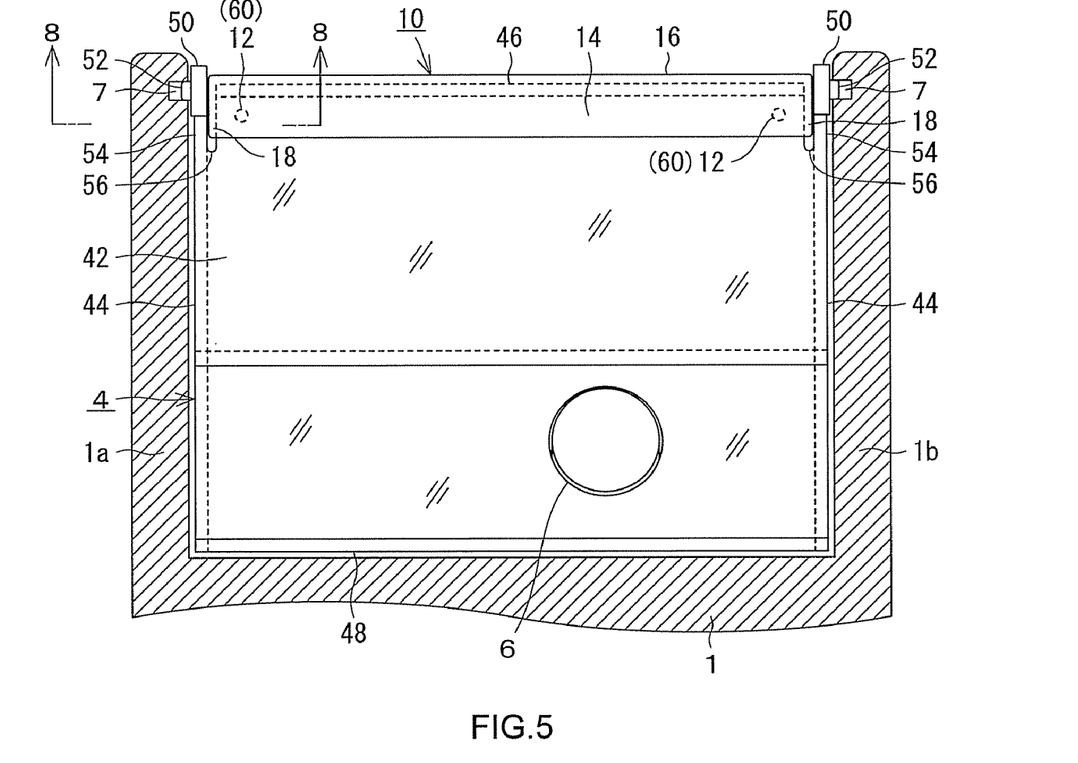
FIG. 5 is a partially broken-away front view of a housing to which mounted is a cover with a cover falling-off preventing attachment according to a first embodiment of the present invention attached thereto.

The attachment 10 is attached to the cover 4 as shown in FIG. 5.

The cover falling-off preventing attachment 10 according to the first embodiment includes coupling means, e.g. a front wall 14 and an upper wall 16, and also two preventing means, e.g. two side walls 18. The front wall 14 is provided with fixing means, e.g. protrusions 12.

Figure 6A:
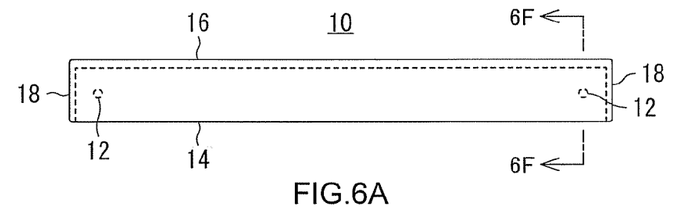
FIG. 6A is a front view of the cover falling-off preventing attachment according to the first embodiment of the present invention.
Figure 6B:
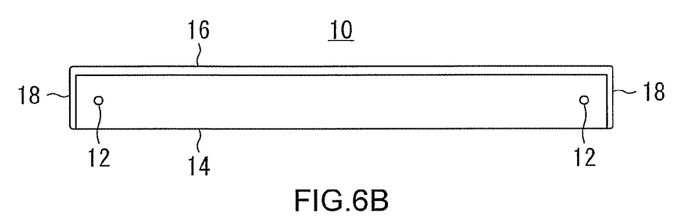
FIG. 6B is a rear view of the cover falling-off preventing attachment of FIG. 6A.

The front wall 14 has a laterally long rectangular shape, and its width, i.e. the dimension measured in the horizontal direction in FIG. 6A, is slightly smaller, by, for example, several tenths of millimeter, than the distance between the outer surfaces of the slits 56 formed in the cover 4 (see, for example, FIG. 2 or 5). The height of the front wall 14, i.e. the dimension measured in the vertical direction in FIG. 6A, is slightly smaller, by, for example, several tenths of millimeter, than the length of the slits 56. The thickness of the front wall 14 is slightly smaller than that of the cover 4, and is about 2 mm, for example. The engagement protrusions 12 extend rearward, i.e. toward the housing 1, from the inside or rear surface of the front wall 14 at appropriate locations. For example, the protrusions 12 are formed at locations near the respective side edges of the front wall 14. The height, or length of the protrusions 12 is slightly smaller than the thickness of the cover 4 and is, for example, about 2 mm. Through-holes 60 are formed in the main section 42 of the cover 4 at such locations as to be able to receive the corresponding protrusions 12.

Figure 6C:
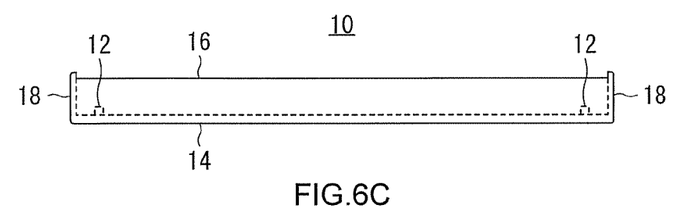
FIG. 6C is a plan view of the cover falling-off preventing attachment of FIG. 6A.
Figure 6D:
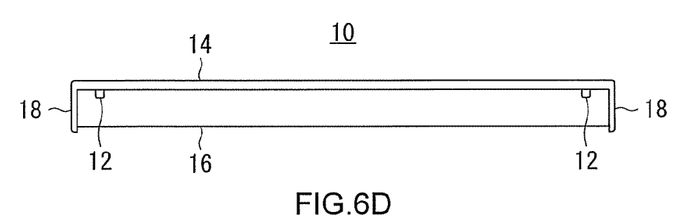
FIG. 6D is a bottom view of the cover falling-off preventing attachment of FIG. 6A.
Figure 6E:
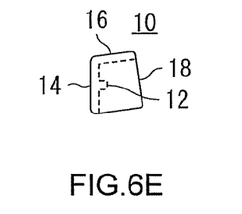
FIG. 6E is a right side view of the cover falling-off preventing attachment of FIG. 6A.
Figure 6F:
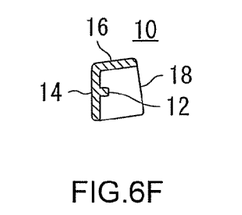
FIG. 6F is a cross-sectional view along a line 6F-6F in FIG. 6A.

The upper wall 16 has a shape of laterally elongated rectangle as the front wall 14. The upper wall 16 extends along the upper edge of the front wall 14 and forms an angle of about 100 degrees with respect to the front wall 14, which is equal to the angle between the main section 42 and upper wall 46 of the cover 4, and its depth dimension, i.e. the dimension measured in the vertical direction in FIG. 6C, is slightly smaller by, for example, several millimeters, than the height of the front wall 14. The width and thickness of the upper wall 16 are the same as those of the front wall 14.

The side walls 18 are joined to the right and left side edges of the front and upper walls 14 and 16, and form right angles with respect to the front and upper walls 14 and 16, respectively. The thickness of the side walls 18 is slightly smaller than the width of the slits 56 and is equal to, for example, about 1.5 mm. The distance between the two side walls 18 is larger, by, for example, several tenths of millimeter, than the distance between the inner side walls of the respective slits 56.

Figure 7A:
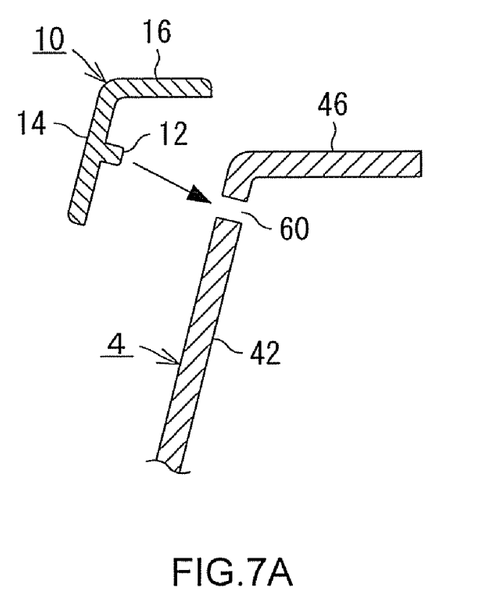
FIGS. 7A and 7B are cross-sectional views showing how the cover falling-off preventing attachment is attached to the cover.
Figure 7B:
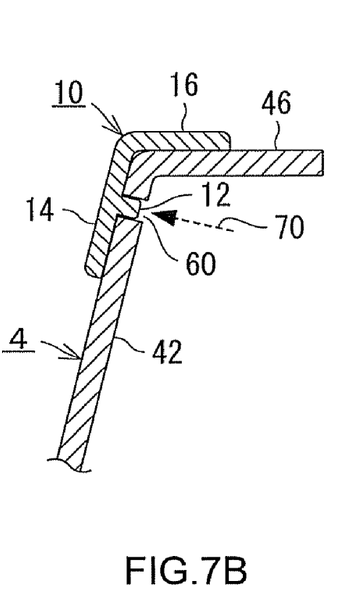

The cover falling-off preventing attachment 10 is a single unit formed of the same material as the cover 4, e.g. polycarbonate. The cover falling-off preventing attachment 10 is attached to the cover 4 in the following manner. As shown in FIG. 5, the inner surface of the front wall 14 is brought into contact with the front surface of the upper portion of the main section 42 of the cover 4 mounted to the housing 1, and the inner (downward facing) surface of the upper wall 16 is brought into contact with the upper surface of the upper wall 46 of the cover 4, with the side walls 18 inserted into the associated ones of the slits 56. During this process of attachment, the protrusions 12 are inserted into the through-holes 60 formed in the cover 4, as shown in FIGS. 7A and 7B. After the protrusions 12 are placed in the through-holes 60, adhesive is applied over the protrusions 12 in the holes 60 and also over the inner surfaces of the holes 60 from inside of the cover 4, as indicated by a broken line arrow 70 in FIG. 7B, so that the cover falling-off preventing attachment 10 can be secured to the cover 4.

Figure 8:
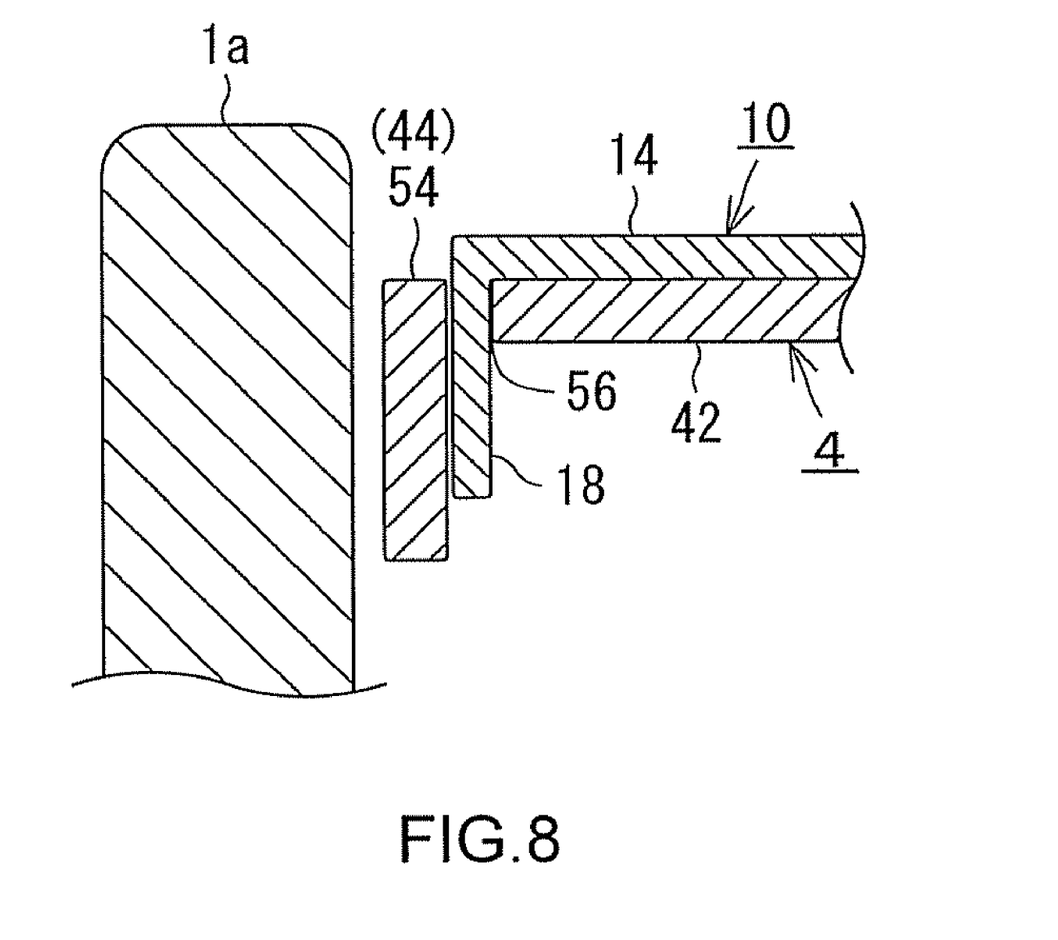
FIG. 8 is a cross-sectional view along a line 8-8 in FIG. 5.

When the cover falling-off preventing attachment 10 is attached to the cover 4 mounted on the housing 1, the slits 56 in the cover 4 are filled with the side walls 18 of the cover falling-off preventing attachment 10, as shown in FIG. 8. As a result, the elastic portions 54 including the protrusions 52 of the cover 4 cannot be deformed, and, therefore, even when external force is exerted to the cover 4, the protrusions 52 do not come out of the holes 7 in which the protrusions 52 in the side walls of the housing 1. Thus, by the simple arrangement of attaching the cover falling-off preventing attachment 10 to the cover 4, the falling off of the cover 4 from the housing 1 can be reliably prevented. In this manner, the cover 4 and, in particular, the elastic portions 54 of the cover 4 can be prevented from being damaged even if the cover 4 fell off the cover 4.

The cover falling-off preventing attachment 10 according to this embodiment is made of transparent and colorless polycarbonate, which is the same material as the cover 4, and, therefore, the design of the cover 4, as a whole, including the cover falling-off preventing attachment 10 is not significantly spoiled.

Figure 9A:
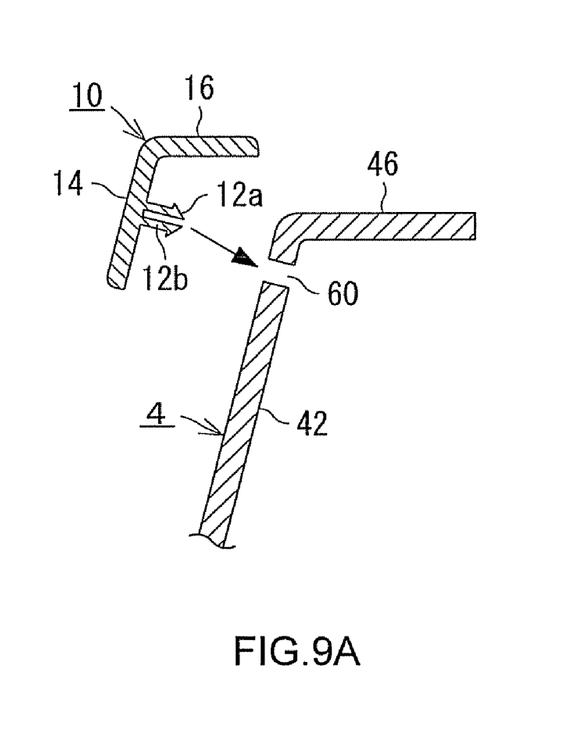
FIGS. 9A and 9B are cross-sectional views showing how a cover falling-off preventing attachment according to a second embodiment of the present invention is attached to the cover.
Figure 9B:
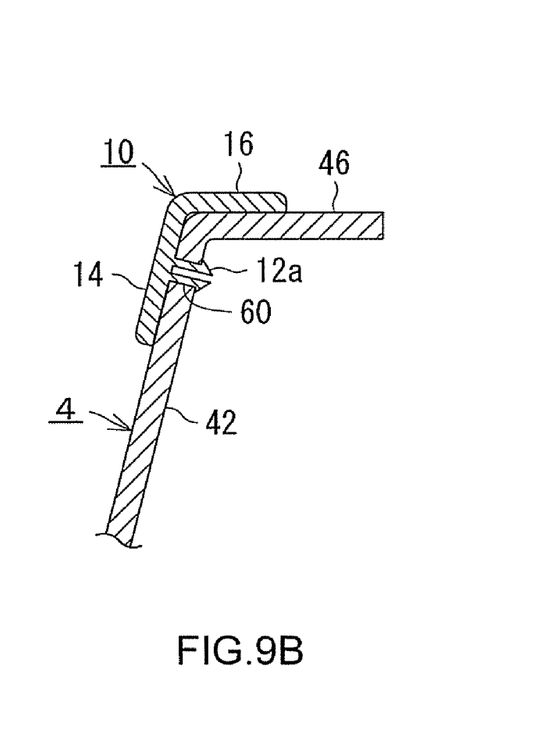

The cover falling-off preventing attachment 10 can be fixed to the cover 4 by other means than the above-described means shown in FIG. 7B. For example, as shown in FIGS. 9A and 9B, two deformable protrusions 12b each having a hollow enlarged tip end 12a may be used. When the protrusions 12b are inserted through the holes 60, the enlarged tip ends 12a engage with the inner surface of the main section 42 of the cover 4 around the respective holes 60, so that the cover falling-off preventing attachment 10 can be secured to the cover 4. If it is necessary to remove the cover falling-off preventing attachment 10 from the cover 4, the enlarged tip ends 12a are elastically deformed toward the centers of the respective holes 60 before the cover falling-off preventing attachment 10 is pulled off.

Figure 10A:
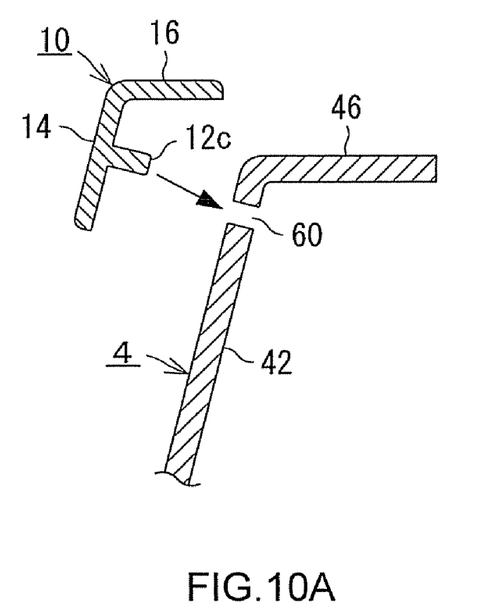
FIGS. 10A and 10B are cross-sectional views showing how a cover falling-off preventing attachment according to a third embodiment of the present invention is attached to the cover.
Figure 10B:
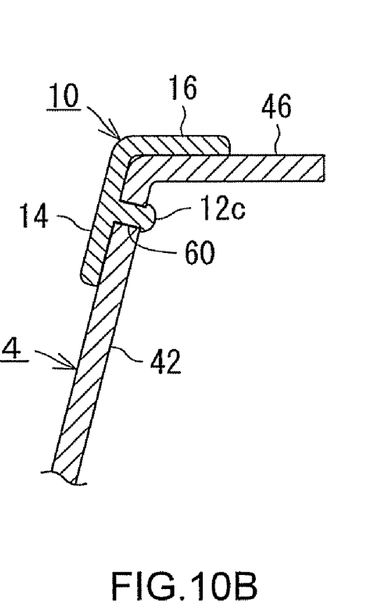

Alternatively, as shown in FIGS. 10A and 10B, the protrusions may be formed to have a length slightly larger than the thickness of the main section 42 so that the tip ends of the protrusions 12 can extend through and out of the holes 60. Then, the tip ends of the protrusions 12 inside the cover 4 are heated to be deformed into a semi-spherical shape, whereby the tip ends of the protrusions 12 can form retaining portions 12c, which engage with the inner surface of the main section 42 around the holes 60.

Figure 11A:
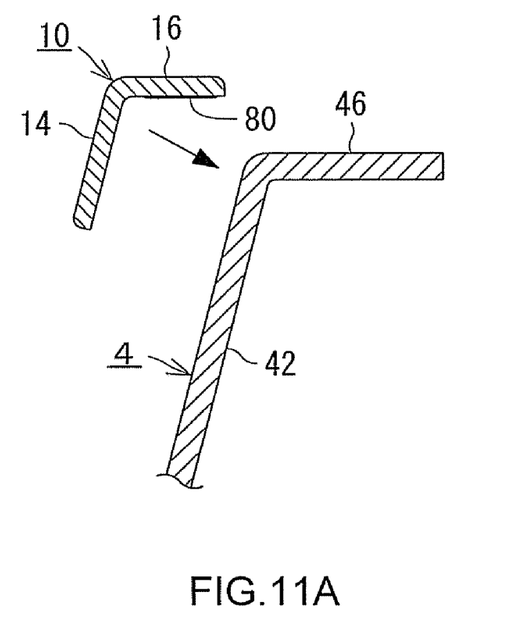
FIGS. 11A and 11B are cross-sectional views showing how a cover falling-off preventing attachment according to a fourth embodiment of the present invention is attached to the cover.
Figure 11B:
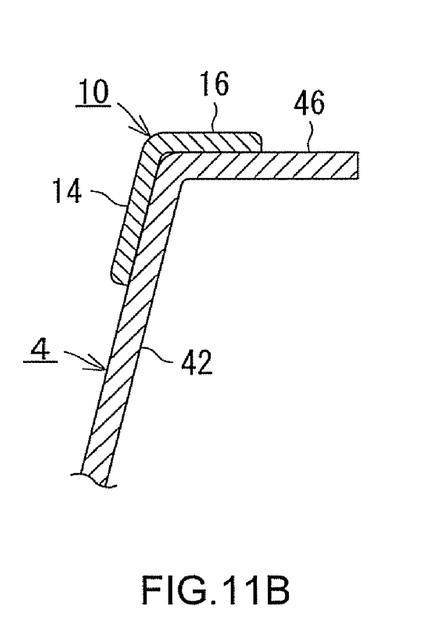

As another alternative, as shown in FIGS. 11A and 11B, the protrusions 12 may be eliminated. Instead, bonding means 80 may be formed on the inner surface of the upper wall 16 of the cover falling-off preventing attachment 10. For example, an adhesive or a doubled-faced adhesive tape may be applied over the inner surface of the upper wall 16. Thus, the cover falling-off preventing attachment 10 can be fixed to the upper wall 46 of the cover 4 by means of the bonding means 80. With such arrangement, there is no need to form the through-holes 60 in the cover 4, so that the present invention can be used for the prior art cover shown in FIGS. 1-4.

Figure 12:
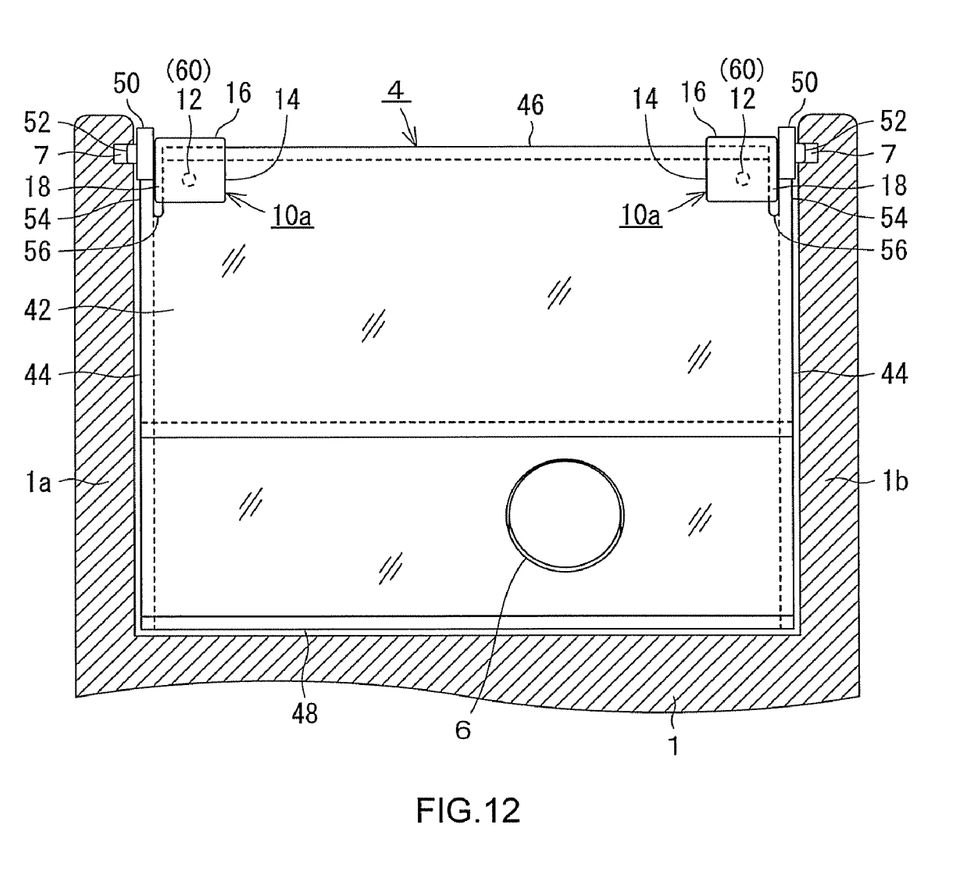
FIG. 12 is a partially broken-away front view of a housing to which mounted is the cover with a cover falling-off preventing attachment according to a fifth embodiment of the present invention attached thereto.

A cover falling-off preventing attachment 10a according to another embodiment is shown in FIG. 12, which is formed of two separate members filling the respective slits 56 in the cover 4. The cover falling-off preventing attachment 10a is equivalent to the cover falling-off preventing attachment 10 shown in, for example, FIG. 5, with the center portions of the front and upper walls 14 and 16 removed so that only the two end portions of the cover falling-off preventing attachment 10 including the protrusions 12 and the side walls 18 can be left. The attachment 10a of this construction, too, can prevent the cover 4 from falling off the housing 1. Because the central portions of the front and upper walls 14 and 16, which may be unnecessary in preventing the falling-off of the cover 4, are removed, the design of the cover 4 as a whole, including the cover falling-off preventing attachment 10a, can be retained better. It should be noted, however, the single-unit attachment 10 is easier to handle than the attachment 10a, when it is positioned with respect to the cover 4, for example.

Although the invention has been described with respect to cover falling-off preventing attachments for the cover 4 of an arc welder power supply apparatus, it can also be applied to covers of other electronic apparatuses and covers of any other machines other than electronic apparatuses.

A cover to which the cover falling-off preventing attachment according to the present invention is to be attached need not be swingable or rotatable, but the cover falling-off preventing attachment according to the invention can be attached to a cover fixed to a predetermined portion of the housing 1. For example, it can be attached to a detachable cover of a battery holder.

The cover falling-off preventing attachment 10 may be formed only of the front wall 14 and the two side walls 18. Also, each of the two members of the attachment 10a shown in FIG. 12 may be formed only of the front wall 14 and the side wall 18. It should be noted, however, that the attachment 10 or 10a having two surfaces contacting the cover 4, which are provided by the front and upper walls 14 and 16, exhibits a better hold to the cover 4 than one with only one contacting surface provided by the front wall 14.

Further, a cover falling-off preventing attachment may be adapted to fill only one of the slits 56 if filling of one slit is sufficient to prevent the cover from falling off. In such case, one of the side walls 18 of the above-described cover falling-off preventing attachment 10 may be removed, or only one of the two members of the attachment 10a may be employed.

The cover falling-off preventing attachment 10 or 10a has been described as being formed from polycarbonate resin, but a resin, such as acrylic resin and ABS, other than polycarbonate resin, or a material other than synthetic resin, such as metal or special paper may be used. It should be noted, however, that, where designing is important, it is desirable to form the attachment 10 or 10*a* from the same material as the cover 4.

The description made herein is only for exemplifying how the present invention can be embodied, and the invention is not limited by such exemplification.

What is claimed is:

1. A cover falling-off preventing attachment for preventing a cover mounted to a housing from falling off the housing, said cover having a retainer deformable in a given direction, said retainer being deformed in said given direction for said cover to be mounted to said housing at a predetermined position thereof, said cover falling-off preventing attachment comprising: preventing means for preventing said retainer of said cover mounted to said housing from being deformed in said given direction, wherein said retainer comprises first and second retaining members protruding outward from respective lateral sides of said cover, said cover falling-off preventing attachment including first and second preventing means for said first and second said retaining members, said retaining members being placed in retaining holes formed in two side walls of said housing, said two side walls being spaced from each other by a distance smaller than the distance between tip ends of said retaining members.

2. The cover falling-off preventing attachment according to claim 1, wherein said cover includes spaces for allowing said retaining members to be deformed in said given direction, and said first and second preventing means extend into each of said spaces to thereby prevent said retaining members from being deformed in said given direction.

3. The cover falling-off preventing attachment according to claim 2, further comprising coupling means for coupling said first and second preventing means together.

4. The cover falling-off preventing attachment according to claim 1, wherein said cover falling-off preventing attachment is formed of the same material as said cover.

5. The cover falling-off preventing attachment according to claim 2, wherein said falling-off preventing attachment is formed of the same material as said cover.

6. The cover falling-off preventing attachment according to claim 3, wherein said cover falling-off preventing attachment is formed of the same material as said cover.

\* \* \* \* \*